United States Patent
Bonen

(10) Patent No.: US 10,404,585 B1
(45) Date of Patent: Sep. 3, 2019

(54) DYNAMICALLY SEGREGATING SOURCES OF INGRESS AT A NODE

(71) Applicant: Harmonic, Inc., San Jose, CA (US)

(72) Inventor: Adi Bonen, Belle Mead, NJ (US)

(73) Assignee: Harmonic, Inc., San Jose, CA (US)

(*) Notice: Subject to any disclaimer, the term of this patent is extended or adjusted under 35 U.S.C. 154(b) by 3 days.

(21) Appl. No.: 15/847,059

(22) Filed: Dec. 19, 2017

Related U.S. Application Data

(60) Provisional application No. 62/436,381, filed on Dec. 19, 2016.

(51) Int. Cl.
| | |
|---|---|
| *H04L 12/721* | (2013.01) |
| *H04B 15/02* | (2006.01) |
| *H04L 12/707* | (2013.01) |
| *H04L 12/28* | (2006.01) |

(52) U.S. Cl.
CPC .......... *H04L 45/70* (2013.01); *H04B 15/02* (2013.01); *H04L 45/22* (2013.01); *H04L 12/2801* (2013.01)

(58) Field of Classification Search
None
See application file for complete search history.

(56) References Cited

U.S. PATENT DOCUMENTS

| | | | | |
|---|---|---|---|---|
| 2013/0004179 | A1* | 1/2013 | Nielsen | H04B 3/50 398/115 |
| 2014/0282783 | A1* | 9/2014 | Totten | H04L 12/2885 725/111 |
| 2016/0072578 | A1* | 3/2016 | Jin | H04J 14/086 398/36 |
| 2016/0294476 | A1* | 10/2016 | Sun | H04B 10/27 |
| 2016/0366052 | A1* | 12/2016 | Chapman | H04L 45/66 |
| 2017/0019239 | A1* | 1/2017 | Jin | H04L 1/004 |
| 2017/0180176 | A1* | 6/2017 | Volkov | H04L 27/2634 |
| 2017/0303273 | A1* | 10/2017 | Jin | H04L 67/16 |

* cited by examiner

*Primary Examiner* — Ajit Patel
(74) *Attorney, Agent, or Firm* — Brokaw Patent Law PC; Christopher J. Brokaw

(57) ABSTRACT

Segregating a node port experiencing ingress. A node that provides a service to a plurality of cable modems may have a plurality of node ports. The node may be a Remote PHY Node or a Remote MACPHY node. In response to detecting that a particular node port of the node is experiencing ingress, the assignment of node ports to upstream device ports are adjusted so that the particular node port experiencing ingress is not be assigned to the same upstream device port as any other node port. In further response to detecting ingress at the particular node port, all node ports assigned to the same upstream device port are caused to be assigned to the same downstream device port. By segregating the node port experiencing the ingress in this manner, the impact of that ingress can be mitigated or eliminated with respect to the other node ports of that node.

9 Claims, 6 Drawing Sheets

DYNAMICALLY SEGREGATING SOURCES OF INGRESS AT A NODE

CLAIM OF PRIORITY AND RELATED APPLICATION DATA

This application claims priority to U.S. Provisional Patent Application Ser. No. 62/436,381, filed Dec. 19, 2016, entitled "CableOS Smart Node ('Ripple')," the contents of which are hereby incorporated by reference for all purposes as if fully set forth herein.

This application is related to U.S. Non-provisional patent application Ser. No. 15/847,099, entitled, "Processing a Signal Originating From a Node Port Experiencing Ingress," invented by Adi Bonen, filed on Dec. 19, 2017, the entire disclosure of which is hereby incorporated by reference for all purposes as if fully set forth herein.

FIELD OF THE INVENTION

Embodiments of the invention relate to dynamically segregating sources of ingress at a node providing service to a plurality of cable modems.

BACKGROUND

A Converged Cable Access Platform (CCAP) is an industry standard platform for transmitting video data and voice content. CCAP is led by CableLabs® of Sunnyvale, Calif. CCAP unifies the Converged Multiservice Access Platform (CMAP), managed by Comcast Corporation of Philadelphia, Pa., with the Converged Edge Services Access Router platform (CESAR), which is managed by Time Warner Cable, Inc. of New York, N.Y.

A virtual Converged Cable Access Platform (CCAP) is software that performs the functions of a hardware-based CCAP. The virtual CCAP may execute on hardware components that include a commercial off-the-shelf switch/router and one or more off-the-shelf computing servers. A commercial example of a virtual CCAP is CableOS™, available from Harmonic, Inc. of San Jose, Calif.

CableLabs has publicly issued a Remote PHY family of specifications known as the MHAv2 specifications (Modular Headend Architecture version 2). These specifications describe how a CCAP platform may be separated into two components, (1) a CCAP Core located at a cable headend, and (2) a Remote PHY node (RPN), which is typically located outdoors.

The CCAP Core may transmit multiple downstream channels to a plurality of RPNs. Each RPN, in turn, may transmit those downstream channels to a plurality of cable modems. Cable modems may send data, via an upstream channel, to the CCAP Core by way of the RPN.

Cable television often suffers from a problem where signals transmitted in the upstream direction from homes to the CCAP Core are interfered with by various noise sources. This type of interference noise is called ingress noise. Such noise sources include electric motors operated inside customers' homes (e.g., hair dryers and vacuum cleaners), switching regulators, and various Shortwave radio communications. Noise from electric motors and switching regulators is typically applied by the offending equipment to the power lines inside the homes, and the noise spreads to the cable television coaxial cable through common grounding of the cable television coaxial cable and the power lines. Noise from Shortwave radio communications is typically picked up by imperfect shielding of the various cables, adapters and customer equipment connected to the cable television coaxial cable. In the past, most ingress sources had a relatively short and temporary effect (e.g., when a hair dryer is used); however, some ingress sources have a continuous and longer-term nature (e.g., switching regulators inside LED light bulbs).

In recent years, a new type of ingress noise has proliferated. High power plant grow lights have become common, even in residential environments. These grow lights are driven by power supplies which are fed by line power. Often, these power supplies produce levels of electronic noise greater than those permitted by the Federal Communication Commission (FCC). These grow lights are often powered on for long periods each day. The ingress noise produced by these grow lights and their power supplies often is so strong that it drowns out and interferes with the regular signals transmitted from homes to the CCAP Core.

Typical CATV deployments have several tens or even several hundreds of homes connected to a single CATV node. The group of homes whose signals are combined into a single upstream receiver is typically called an upstream service group. Signals from an upstream service group are received at a node receiver or relayed over an optical link to a receiver in the headend/hub. Ingress noise originating from any one home in an upstream service group can interfere with the reception of transmissions from all homes in that upstream service group.

Ingress noise often occurs at the lower frequencies of the totality of the CATV usable frequency range. The noise amplitude of ingress noise also declines at higher frequencies. As a result, and due to the frequency allocation of the CATV spectrum where downstream signals are allocated at higher frequencies than upstream signals, ingress noise interferes more with upstream signals than downstream signals. Typically, the lower the frequency of an upstream signal, the more susceptible that upstream signal is to ingress noise.

The implementation of CATV nodes and other active devices in the upstream signal path from homes to the upstream receiver often has active devices for amplifying and processing the signals (e.g., RF amplifiers, laser transmitters, analog to digital converters, and so on). These devices are normally optimized such that signals at and around a small range of the expected signal level have the least amount of noise and distortion added by the active components. However, a strong ingress noise may cause a significant amount of distortion to be introduced by the active components, and can sometimes even completely saturate the signal path.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for dynamically segregating sources of ingress at a node providing service to a plurality of cable modems are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention may be used to identify a node port of a node providing service to a plurality of cable modems which is operating as a source of ingress. Non-imitating, illustrative examples of nodes on which the invention may be embodied include Remote PHY nodes and Remote MACPHY node (RMN). Once a particular node port of a node has been identified as operating as a source of ingress, that node port may be segregated from other node ports of that node with respect to how that node processes upstream traffic. In this way, the impact of a node port operating as a source of ingress (such as may be case when that node port services a cable subscriber home affected by ingress caused by dirty LED lighting) can be mitigated or eliminated with respect to the other node ports of that node.

Upstream and Downstream Service Groups

Figure 1:
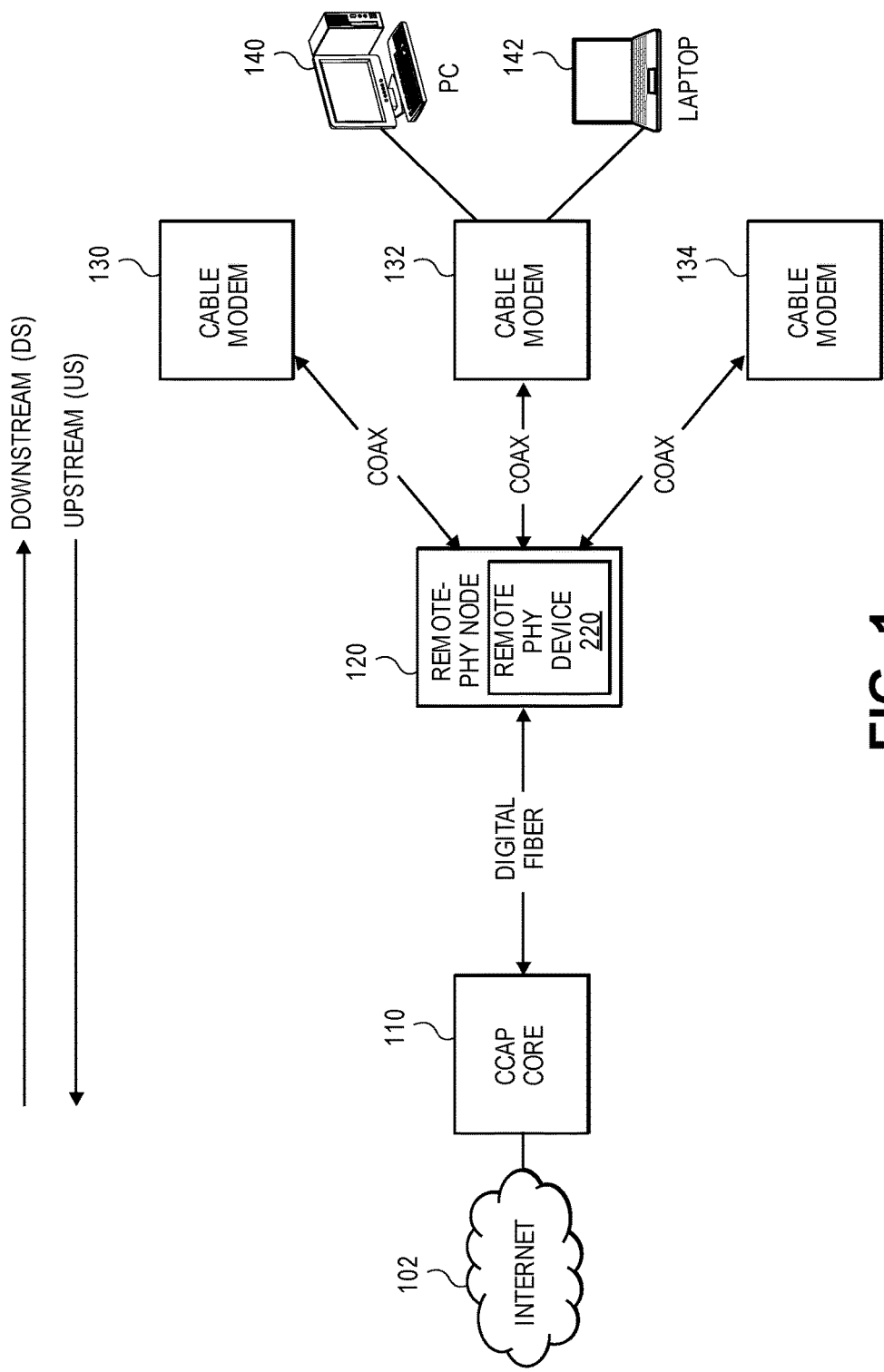
FIG. 1 is a block diagram of a CCAP platform which includes a Remote PHY node (RPN) in accordance with an embodiment of the invention.

FIG. 1 depicts a downstream (DS) direction (i.e., CCAP Core 110 to cable subscribers' network devices) and an upstream (US) direction (i.e., cable subscribers' network devices to CCAP Core 110).

In a CCAP system, a Remote PHY device may support a different number of upstream service groups, each service group typically implemented by a different physical upstream port in the Remote PHY device, than downstream service groups and ports. For example, a Remote PHY device in a Remote PHY node commonly supports one downstream service group (one downstream port) and two upstream service groups (two upstream ports). The reason for this is that there is much less available spectrum in the CCAP platform in the upstream direction relative to the downstream direction. As a result, there is much less capacity for data to be sent in an upstream direction.

To help address the reduced capacity inherent in the upstream direction, the number of Remote PHY device upstream ports supported by a Remote PHY node can be increased to two, where each upstream port corresponds to half of the available Remote PHY node upstream capacity, but utilizing the complete available upstream spectrum. Having two upstream ports mitigates the impact to cable modem users serviced by the Remote PHY node when a cable modem is consuming a large amount of upstream bandwidth, as only those cable modems using the same upstream port will be adversely affected. In other cases, the Remote PHY device in a Remote PHY node may support two downstream ports as well as two upstream ports, doubling the potential data throughput capacity in both the upstream and downstream directions. Having two downstream ports mitigates the impact to cable modem users serviced by the Remote PHY node when a cable modem is consuming a large amount of downstream bandwidth, as only those cable modems using the same downstream port will be adversely affected.

A Remote PHY node typically comprises a plurality of coaxial ports, very often four ports, each of which is typically connected via coax cable to a number of different buildings, each of which may have one or more cable modems. When a Remote PHY node is installed, the person performing the installation assigns and physically connects, as per the Remote PHY node RF routing capabilities, each of the Remote PHY node ports to a Remote PHY device downstream port and a Remote PHY device upstream port. Accordingly, cable modems serviced by each of the Remote PHY node ports are thus assigned to a particular Remote PHY device upstream port and downstream port. This assignment is typically made with best efforts to evenly distribute cable modems among the available upstream and downstream ports, but with limited information about current or potential future population of cable modems. Any allocation of the cable modems connected through the Remote PHY node ports to Remote PHY device upstream and downstream ports in a CCAP platform is fixed at the time of installation of the Remote PHY node in the present state of the art.

Architecture Overview

FIG. 1 is a block diagram of a CCAP platform which includes a Remote PHY node 120 and a Remote PHY device 220 in accordance with an embodiment of the invention. The CCAP platform shown in FIG. 1 includes CCAP Core 110, Remote PHY node 120, a plurality of cable modems 130, 132, 134, and cable subscriber network devices 140, 142. The CCAP platform shown in FIG. 1 may be implemented by a virtual CCAP platform that executes on hardware components that include a commercial off-the-shelf switch/router and one or more off-the-shelf computing servers. A commercial example of a virtual CCAP is CableOS™, available from Harmonic, Inc. of San Jose, Calif.

CCAP Core 110, as broadly used herein, refers to a CCAP Core as described in the Remote PHY family of specifications, known as the MHAv2 specifications and administrated by CableLabs®. CCAP Core 110 may include or correspond to a Cable Modem Termination System (CMTS) in an embodiment. CCAP Core 110 may communicate over Internet 102 (as shown in FIG. 1) or one or more private networks (not depicted in FIG. 1).

CCAP Core 110 is typically located at a headend and is used to provide high speed data services to network devices. For example, FIG. 1 depicts two network devices 140, 142, each of which exchanges data with cable modem 132, which in turn exchanges data with CCAP Core 110 by way of Remote PHY node 120. As will be readily appreciated, a practical implementation of a CCAP platform will include many different Remote PHY nodes 120, many different cable modems, and many different network devices; however, for simplicity and ease of explanation, the large numbers of those entities are not depicted in FIG. 1.

Remote PHY node 120, with the assistance of a Remote PHY device 220 (described in more detail below) converts downstream DOCSIS data, MPEG video, and out-of-band (OOB) signals from digital to analog and upstream data, video, and OOB signals from analog to digital. A non-limiting, illustrative example of Remote PHY node 120 is the CableOS™ Ripple-1 Remote PHY node, available from Harmonic, Inc. of San Jose, Calif. While only a single Remote PHY node 120 is depicted in FIG. 1, practical implementations will a large plurality of Remote PHY nodes in communication with CCAP Core 110.

Remote PHY node 120 is designed to be deployed outdoors near the physical locations of cable modems 130, 132, 134. Remote PHY node 120 is composed of an outer housing that is designed to provide a hermetically sealed environment to the interior of Remote PHY node 120 to protect internal components from outdoor environmental factors, such as humidity, water, debris, and changes in pressure. While only three DOCSIS cable modems are depicted in FIG. 1, practical implementations will have varying numbers of cable modems serviced by a particular Remote PHY node 120. For example, it is not uncommon for more than 100 cable modems to be serviced by a single Remote PHY node 120.

Figure 2:
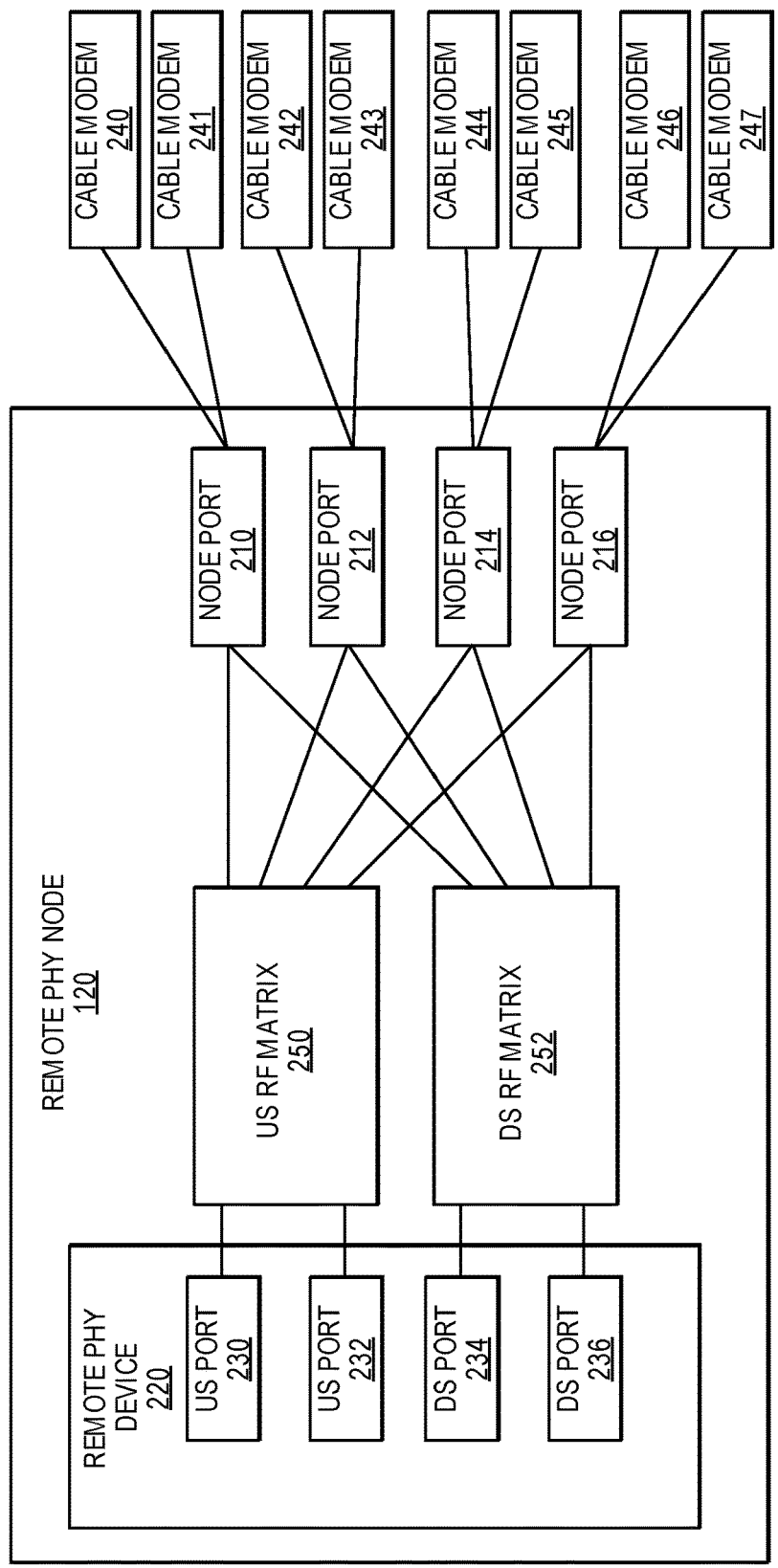
FIG. 2 is a block diagram of a Remote PHY node (RPN) according to an embodiment of the invention.

One such internal component enclosed by Remote PHY node 120 is a Remote PHY device 220. FIG. 2 is a block diagram of a Remote PHY node 120 according to an embodiment of the invention. Remote PHY node 120 may comprise one or more Remote RHY devices 220. Remote RHY device 220 is a computerized device which performs many of the functions involved in converting downstream DOCSIS data, MPEG video, and out-of-band (OOB) signals from digital to analog and upstream data, video, and OOB signals from analog to digital. A non-limiting, illustrative example of Remote RHY device 220 is Harmonic, Inc.'s CableOS™ Pebble-1 Remote PHY device.

FIG. 2 depicts external coaxial ports of Remote PHY node 120 (individually referred to herein as a "node port"), upstream ports of Remote PHY device 220 (individually referred to herein as an "upstream device port") and downstream ports of Remote PHY device 220 (individually referred to herein as a "downstream device port"). As shown in FIG. 2, Remote PHY node 120 comprises four node ports, namely node ports 210, 212, 214, and 216. The number of node ports on Remote PHY node 120 can vary, as FIG. 2 is an illustration of one example. A set of buildings (which each may comprise zero, one, or two or more cable modems) are typically connected to a node port of Remote PHY node 120 via coaxial cable. The number of cable modems that are connected to each node port of Remote PHY node 120 are not necessarily evenly balanced, although that is generally the intent when the Remote PHY node 120 is initially deployed.

Remote PHY device 220 may comprise one or more downstream (DS) device ports, such as downstream device ports 234 and 236, and one or more upstream (US) device ports, such as upstream device ports 230 and 232. In the normal operation of Remote PHY device 220, each node port of Remote PHY node 120 is permanently assigned to a particular upstream device port and a particular downstream device port of Remote PHY device 220. However, according to an embodiment of the invention, an upstream RF matrix 250 may be used to dynamically assign each node port of Remote PHY node 120 to a particular upstream device port of Remote PHY device 220 under local or remote control supervision, and a downstream RF matrix 252 may be used to dynamically assign each node port of Remote PHY node 120 to a particular downstream device port of Remote PHY device 220 under local or remote control supervision. In transmitting data in the upstream direction, every cable modem 240 through 247 connected to the Remote PHY node 120 transmits data over a particular Remote PHY node 120 node port to a particular upstream device port of Remote PHY device 220. After receiving the data on a particular upstream device port, Remote PHY device 220 will transmit the data in the upstream direction to CCAP Core 110. In transmitting data in the downstream direction, CCAP Core 110 will transmit the data in the downstream direction to Remote PHY device 220, which will transmit data over a particular downstream device port 234 or 236 of Remote PHY device 220, and through all particular node ports of Remote PHY node 120 connected to that particular downstream device port, to the cable modems connected to those node ports. As the data arrives at all the cable modems connected to these node ports, and as determined by the DOCSIS protocol, some data will be received by just a single cable modem, some data will be received by several of these cable modems, and some data will be received by all of these cable modems.

Dynamically Adjusting Upstream Spectrum Usage

Figure 3:
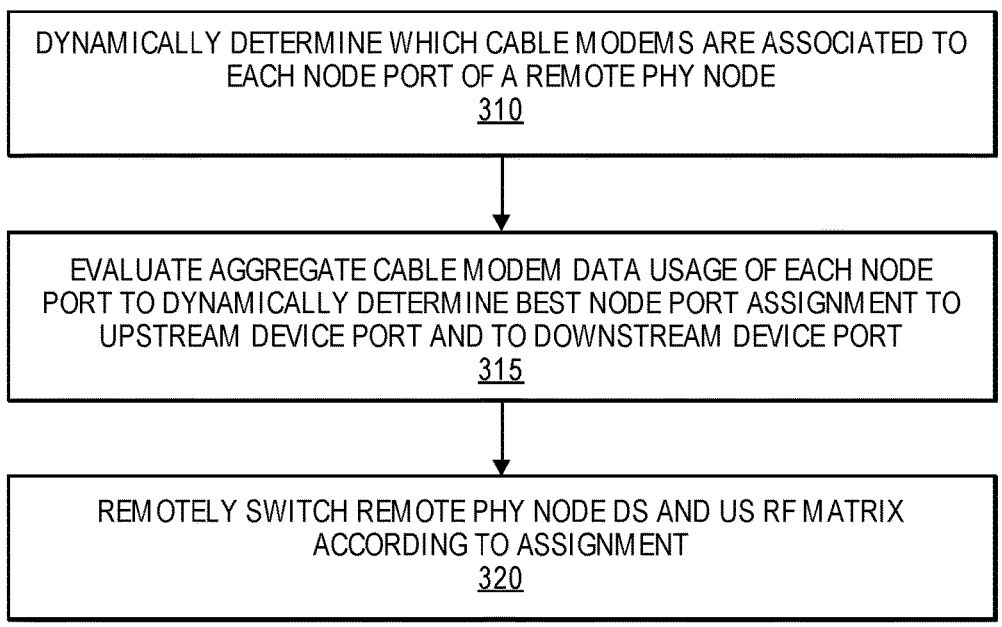
FIG. 3 is a flowchart illustrating the functional steps of dynamically segregating sources of ingress at a Remote PHY node (RPN) according to an embodiment of the invention.

FIG. 3 is a flowchart illustrating the functional steps of dynamically adjusting upstream and downstream spectrum usage by Remote PHY node 120 according to an embodiment of the invention. The steps of FIG. 3 will be described below with reference to FIG. 2. As shall be discussed in greater detail below, each step of FIG. 3 may be performed by remotely controlling Remote PHY node 120. For example, in an embodiment, each step of FIG. 3 may be performed at CCAP Core 110, e.g., in a Cable Modem Termination System (CMTS) that corresponds to, or is included within, CCAP Core 110.

In step 310, a dynamic determination is made as to which cable modems in the CCAP platform are associated with each node port of Remote PHY node 120. Embodiments may employ different approaches for gathering association information that identifies which cable modems are associated with each node port of Remote PHY node 120. Association information may be used (as described below in step 320) for adjusting how node ports are assigned to upstream device ports and downstream device ports. By adjusting how node ports are assigned to upstream device ports and downstream device ports, CCAP Core 110 performs load balancing on upstream and downstream traffic in the CCAP platform as well as manages the prioritization of upstream and downstream traffic.

Obtaining Association Information

One approach for dynamically determining association information in step 310 involves changing the upstream device port assignment of node ports of Remote PHY node 120. This approach is well suited for use after powering on Remote PHY device 220. After Remote PHY device 220 is powered on, CCAP Core 110 will assign each node port to upstream device port and downstream device port of Remote PHY device 220 using a default assignment algorithm. For example, node ports 210 and 212 may be assigned to upstream device port 230 and to downstream device port 234, and node ports 214 and 216 may be assigned to upstream device port 232 and to downstream device port 236.

After all cable modems connected to Remote PHY node 120 have registered with CCAP Core 110 after Remote PHY device 220 has been powered on, CCAP Core 110 will have some, but not sufficient, information about which node port each cable modem is located on, e.g., cable modems 240 through 243 may be known to be either on node port 210 or 212, and cable modems 244 through 247 may be known to be either on node port 214 or 216. CCAP Core 110 can make a temporary change to the previous node ports to upstream and/or downstream device ports assignment. For example, node ports 210 and 214 may be assigned to upstream device port 230, and node ports 212 and 216 may be assigned to upstream device port 232, without changing node port to downstream device port assignment. After that assignment change, CCAP Core 110 invokes a deliberate communication with each cable modem (such as using the DOCSIS protocol periodic ranging operation or any other command that requires the cable modem to transmit in the upstream direction) and determines the change (if occurred) in the upstream device port at which the data from the cable modem was received. Thereafter, the CCAP Core 110 has sufficient information of all cable modems association to node ports.

Note that when temporarily making the change as in the example above to the node ports to upstream device ports assignment, the cable modems which had their upstream device port assignment changed are not aware of that change. There is no need to invoke the DOCSIS protocol messages that will provide the cable modem with the knowledge of how to properly operate under this new upstream device port assignment since the CCAP Core 110 manages this operation in a special way not described or specified by the DOCSIS protocol. Accordingly, CCAP Core 110 must synchronize the MAPs on the channel(s) used on the different upstream device ports to resolve the location of those cable modems, and reserve the appropriate upstream transmission opportunities given to cable modems on the corresponding channels of both US ports, such that the upstream transmission opportunities given to cable modems will not collide with other opportunities regardless of the US port that each cable modem ends up on during this temporary upstream device port assignment change. After CCAP Core 110 resolves the CM's actual node port, it may need to return the node ports to upstream device ports assignment to the original default assignment. Alternatively, if the CCAP Core 110 determines that a different node port to downstream device port and/or upstream device port assignment is more advantageous, the CCAP Core 110 will use the appropriate DOCSIS protocol messages to officially move the cable modems affected by the assignment changes to the upstream device port and downstream device ports to which the cable modems are actually connected.

Due to the MAP synchronization required by the above scheme, scheduling upstream data traffic when the node port association is unknown is complicated and wasteful of bandwidth capacity. Consequently, dynamically determining association information in step 310 by changing the upstream device ports assignment of the node ports is more appropriate after powering on Remote PHY node 120, as soon as most, or all, of the cable modems serviced by the Remote PHY device 220 have registered, but before actual normal upstream traffic has started.

Another approach for dynamically determining association information in step 310 involves selectively modifying RF gain in the upstream path per node port of Remote PHY node 120. This approach is particularly well suited in determining the node port location of a new cable modem that joins an already established and operational CCAP system (e.g., as would happen when a particular cable modem serviced by Remote PHY device 220 is reset), as this approach has minimal impact on existing upstream traffic of other cable modems.

Figure 4:
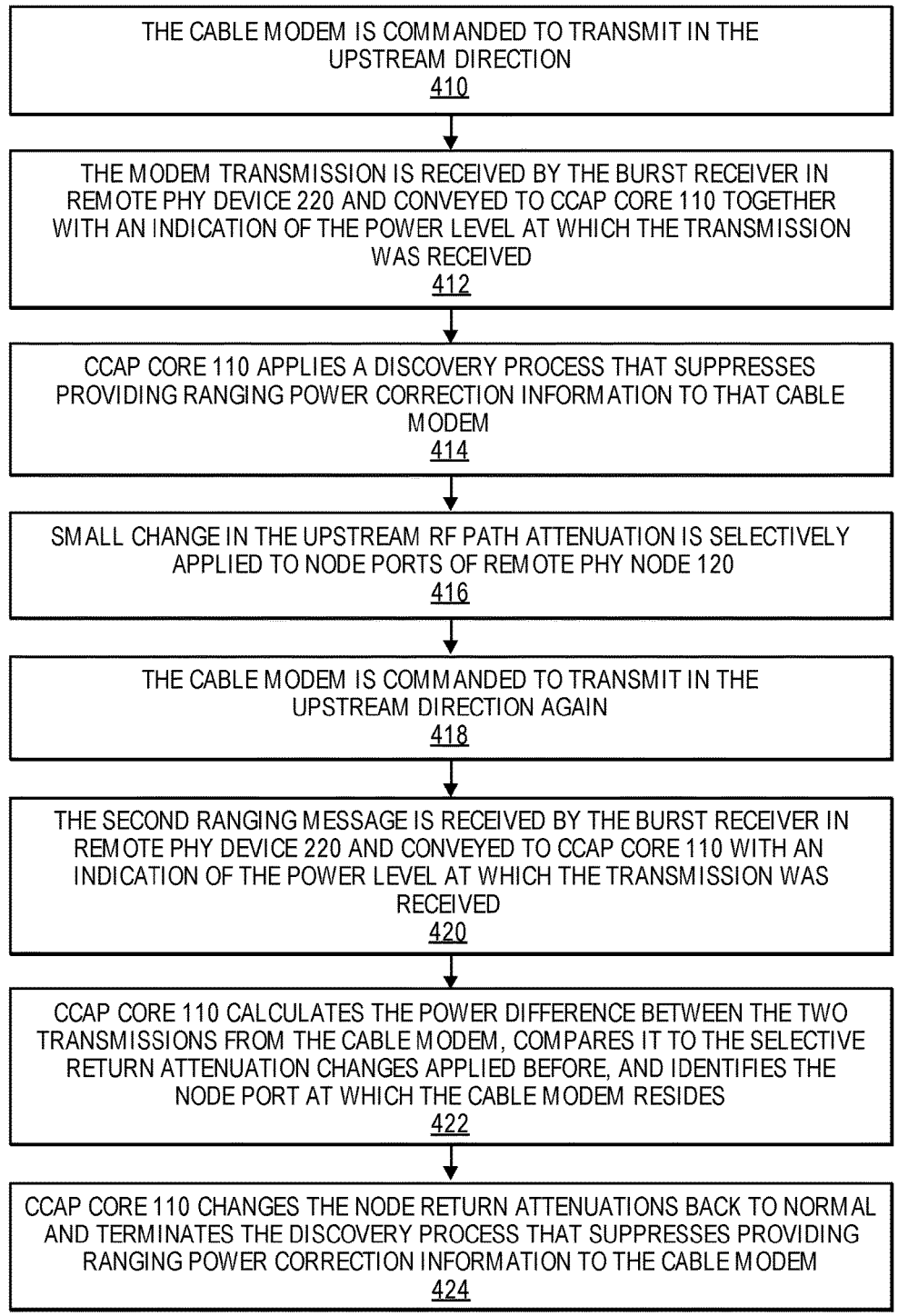
FIG. 4 is a flowchart illustrating an approach for determining association information according to an embodiment of the invention.

In an embodiment, association information may be dynamically determined by selectively modifying the RF gain in the upstream path per node port, and observing the resulting changes in power level for each cable modem. Such an embodiment is depicted in FIG. 4, which is a flowchart illustrating an approach for determining association information according to an embodiment of the invention. In step 410, while the node port is configured for nominal US gain for all return ports, the cable modem is commanded to transmit in the upstream direction, for example, by being given a periodic ranging opportunity on a select upstream channel. In step 412, the modem transmission is received by the burst receiver in Remote PHY device 220 and conveyed to CCAP Core 110 together with an indication of the power level at which the transmission was received, as done with periodic ranging message. In step 414, CCAP Core 110 applies a discovery process that suppresses providing ranging power correction information to that cable modem. In step 416, a small change in the upstream RF path attenuation is selectively made to node ports of Remote PHY node 120. In step 418, the cable modem is commanded again to transmit in the upstream direction, for example, by given another periodic ranging opportunity, preferably with identical parameters as before, for example, the same channel and same minislot in an Orthogonal frequency-division multiplexing (OFDM) channel. In step 420, the second ranging message is received by the burst receiver in Remote PHY device 220 and conveyed to CCAP Core 110, again, together with an indication of the power level at which the transmission was received. In step 422, CCAP Core 110 calculates the power difference between the two transmissions from the cable modem, compares it to the selective return attenuation changes applied before and identifies the node port at which the cable modem resides. Uncertainty in determination of the node port may require another repetition of steps 416, 418, 420, and 422. In step 424, CCAP Core 110 then changes the node return attenuations back to normal and terminates the discovery process that suppresses providing ranging power correction information to cable modems.

If the current assignment of Remote PHY node 120 employs two node ports connected to (assigned to) the upstream device port of Remote PHY device 220 through which the cable modem is connected to the CCAP Core 110, then a certain attenuation change should be applied (example, +1 dB) to one node port and a different one applied (example, −1 dB) to the other node port.

If the current assignment of Remote PHY node 120 employs three node ports connected to (assigned to) the upstream device port of Remote PHY device 220 through which the cable modem is connected to the CCAP Core 110, then a certain attenuation change should be applied (example, +2 dB) to the first node port, a different one applied (example, 0 dB) to the second node port, and a third one applied (example, −2 dB) to the third node port.

If the current assignment of Remote PHY node 120 employs four node ports connected to (assigned to) the upstream device port of Remote PHY device 220 through which the cable modem is connected to the CCAP Core 110, then certain attenuation changes to the four node ports should be applied with a unique change per node port (example, +3, +1, −1, −3 dB).

If the current assignment of Remote PHY node 120 employs only one node port connected to (assigned to) the upstream device port of Remote PHY device 220 through which the cable modem is connected to the CCAP Core 110, the cable modem's node port is already known, and a repeated upstream transmission from that cable modem is not required.

Reassigning a Node Port to a Different Particular Upstream and/or Downstream Device Port In step 315, the aggregate cable modem data usage of each node port may be evaluated to dynamically determine the best node port assignment to each upstream device port and to each downstream device port. The criteria for determining which node port assignment is deemed "best" may be based on different approaches, as discussed below. For example, a node port assignment may be deemed best or desirable if doing so promotes a load balanced system.

Thereafter, in step 320 of FIG. 3, a particular node port of Remote PHY node 120 is remotely switched from a first device port to a second, different device port. For example, in performing step 320, node port 214 may be reassigned from upstream device port 230 to upstream device port 232. Advantageously, by dynamically switching a particular node port of Remote PHY node 120 to different upstream device port of Remote PHY device 220, a particular node port may be reassigned to different DOCSIS upstream and/or downstream service groups on the fly and in real-time. Using this approach, load balancing may be performed on upstream and downstream traffic sent between cable modems 240 through 247 and CCAP Core 110 by dynamically adjusting to which upstream and downstream device ports of Remote PHY device 220, each node port of Remote PHY node 120 is assigned.

Embodiments may perform such load balancing of upstream and downstream traffic by considering one or more factors or considerations. For example, a measured amount of upstream and downstream traffic sent by each of a set of cable modems to identify the optimal node-port assignment to maximize overall data throughput for all cable modems. This approach is adaptive in that the node-port assignment to device ports of the Remote PHY device 220 may be changed in real-time based on presently occurring upstream and downstream traffic conditions.

Since load balancing of upstream and downstream traffic may be performed in step 320 by CCAP Core 110, and as CCAP Core 110 has visibility into the service plans associated with each cable modem, then embodiments may also perform load balancing of upstream traffic by considering the service plan associated with each of said set of cable modems. In this way, if a cable modem is associated with a service plan that guarantees a certain amount of upstream and/or downstream capacity, that capacity may be monitored, and the node-port associated of that cable modem may be adjusted as needed over time to ensure the requirements of the service plan are satisfied. Alternatively, if the service plans associated with a set of cable modems displays a certain bias indicating a higher concentration of high data rate plan subscribers in any node port, that node port can be given an appropriate priority in assigning the node ports to upstream and/or downstream device ports.

In an embodiment, rather than dynamic and real-time traffic related node port assignment for load balancing, a scheduled and predetermined approach may be used. An example is a Remote PHY node serving a mix of residential and commercial customers. The assignment of node ports to device ports may be guided according to workhour schedule such that the commercial customers get preferential capacity during business open days and hours, whereas residential subscribers get a preferential capacity when businesses are closed.

While embodiments have chiefly been described with respect to a Remote PHY node, other embodiments of the invention may be implemented by a Remote MACPHY node (RMN). CableLabs has also issued a technical report about the R-MACPHY architecture and is currently undertaking an effort to formalize a specification for R-MACPHY products, specifically a Remote MACPHY Device (RMD) which resides in a Remote MACPHY node (RMN). This technical report describes Remote MACPHY (or MAC-PHY) as a generic term given to the distributed CMTS/CCAP architecture where the DOCSIS MAC and PHY layer processing of a CMTS are moved from the headend down to a Fiber Node location. Those in the art shall appreciate that in the above teachings, the principles and examples discussed in relation to a Remote PHY node are equally applicable to a Remote MACPHY node.

Dynamically Segregating Sources of Ingress

Current cable operator outside plant architecture approaches have minimal automation features and are not designed to allow dynamic mitigation of upstream ingress noise. Advantageously, embodiments of the invention provide for a dynamically aware outside plant architecture that allows, from a centralized location such as CCAP Core 110, a node port of a node that is exhibiting disruptive ingress to be segregated. Such segregation may be performed automatically (without human intervention) based upon human specified operational thresholds or on-the-fly per human instruction.

Figure 5:
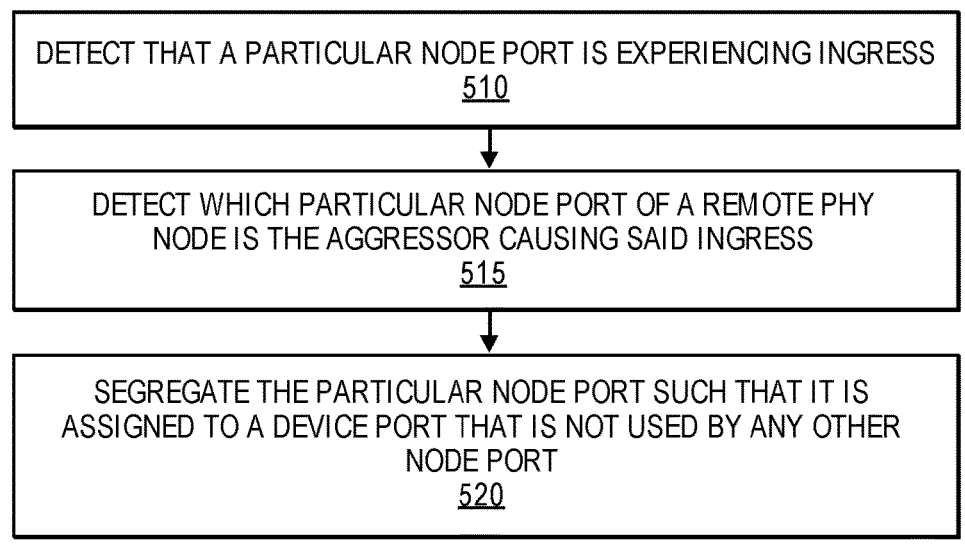
FIG. 5 is a flowchart of dynamically segregating sources of ingress at a node providing service to a plurality of cable modems according to an embodiment of the invention.

FIG. 5 is a flowchart of dynamically segregating sources of ingress at a node providing service to a plurality of cable modems according to an embodiment of the invention. In embodiments involving a Remote PHY node, the steps of FIG. 5 may be performed at CCAP Core 110. In other embodiments, such as those embodiments implemented using a Remote MACPHY node, the steps of FIG. 5 may be performed at the node itself. For purposes of providing a concrete example, the steps of FIG. 5 shall be described with respect to a Remote PHY node, but other embodiments may be embodied in other operational contexts, such as but not limited to a Remote MACPHY node.

In step 510, a particular upstream device port of a Remote PHY device that is experiences ingress is detected. Embodiments may use various techniques to identify that a certain upstream channel or multiple channels in a particular device port of a Remote PHY device is experiencing a high degree of ingress. Embodiments may use various techniques for determining what constitutes a high degree of ingress, e.g., a high degree of ingress may correspond to any amount of ingress at or above a predetermined threshold.

In step 515, once ingress has been detected on a particular upstream device port of a Remote PHY device, embodiments may use one of the aforementioned techniques (such as segmentation or attenuation) to discover the aggressor node port, i.e., the node port through which the ingress noise is combined into the particular upstream device port of a Remote PHY device on which ingress has been detected. Note that when return attenuation is used to discover the ingress source, it is better to increase the attenuation of one port of a time by a large value (e.g., 20 dB) to get a more quantifiable change in the ingress. It is also preferred to schedule quite time on the specific channels which suffer ingress to enable better observation of that ingress.

Thereafter, in step 520, the particular node port experiencing the ingress is segregated such that it is assigned to an upstream device port of a Remote PHY device that is not used by any other node port. In an embodiment, when ingress is identified on a particular node port of remote PHY node 220, the performance of upstream load balancing may be deprioritized in favor of isolating that node port. For example, with reference to FIG. 2, if node port 210 were to be identified as exhibiting ingress, then node port 210 may be isolated from node ports 212, 214, and 216 by assigning node port 210 to one upstream device port (for example, US port 230), while node ports 212, 214, and 216 are combined into a separate, different upstream device port (for example, US port 232). While isolating a node port in this manner reduces the bandwidth available to the other node ports which are not experiencing ingress (in this example, node ports 212, 214, and 216), it is preferable to having a large ingress interference group.

A port that is experiencing ingress may be segregated in step 520 regardless of whether Remote PHY node 120 supports one downstream service group (one downstream port) and two upstream service groups (two upstream device ports) or two downstream service groups (two downstream device ports) and two upstream service groups (two upstream device ports). However, according to the DOCSIS protocol, since an upstream service group is typically governed by the transmission on a single downstream service group, a Remote PHY node 120 that supports two downstream service groups (two downstream device ports) and two upstream service groups (two upstream device ports), may require adjusting the DS RF matrix 252 when the US RF matrix 250 is adjusted such that all the node ports that are combined into a single US port are also connected to a single DS port (in the example, US port 230 and DS port 234 are connected to node port 210, and US port 232 and DS port 236 are connected to node ports 212, 214, and 216).

If the ingress is bandwidth limited and does not affect most of the available upstream spectrum, then embodiments may be configured to minimize the use of that affected frequency range rather than applying a segmentation change. However, a strong ingress may cause saturation in amplifiers and Analog to Digital Converters (ADC), and as a result, may affect all upstream channels on the affected upstream device port. In such a case, segregating the node port experiencing the ingress is desirable.

Once the aggressor node port (i.e., the node port experiencing the ingress) is isolated, several other operations may be implemented to minimize the effect of the ingress on upstream transmissions of cable modems associated with that node port. As an example, upstream signal attenuation on that node port may be increased, as doing so prevents any possible clipping/saturation of amplifiers and ADC in that port's upstream path. Once clipping/saturation is prevented, the ingress will likely affect a smaller portion of the upstream spectrum and optimization of the clean spectrum portion is possible.

After increasing upstream RF attenuation, re-ranging is required for all the cable modems connected to that node port. These cable modems will need to use a higher power level to reach Remote PHY device 220 at the target received power of the receiver. That process will increase the signal to noise ratio (SNR) of their transmitted signals (especially relative to the ingress). However, some cable modems may not possess a sufficient power margin available to perform this operation. Accordingly, CCAP Core 110 may be configured to optimize the operation of power deficient cable modems. Such optimizations may include various established DOCSIS schemes, such as reducing number of channels used by the cable modem, utilizing maximum scheduled minislots, or if needed, reducing the modulation depth of upstream transmissions and allowing a cable modem to be received with a power level lower than the target power level. Other ingress control methods may also be used (e.g., increasing FEC strength.).

Once CCAP Core 110 detects that the ingress on the aggressor node port has disappeared, it is expected that normal operation is resumed. Consequently, CCAP Core 110 may reverse the operations taken as part of the ingress control and allow load balancing to be performed instead of node port segmentation.

Implementing Hardware

Figure 6:
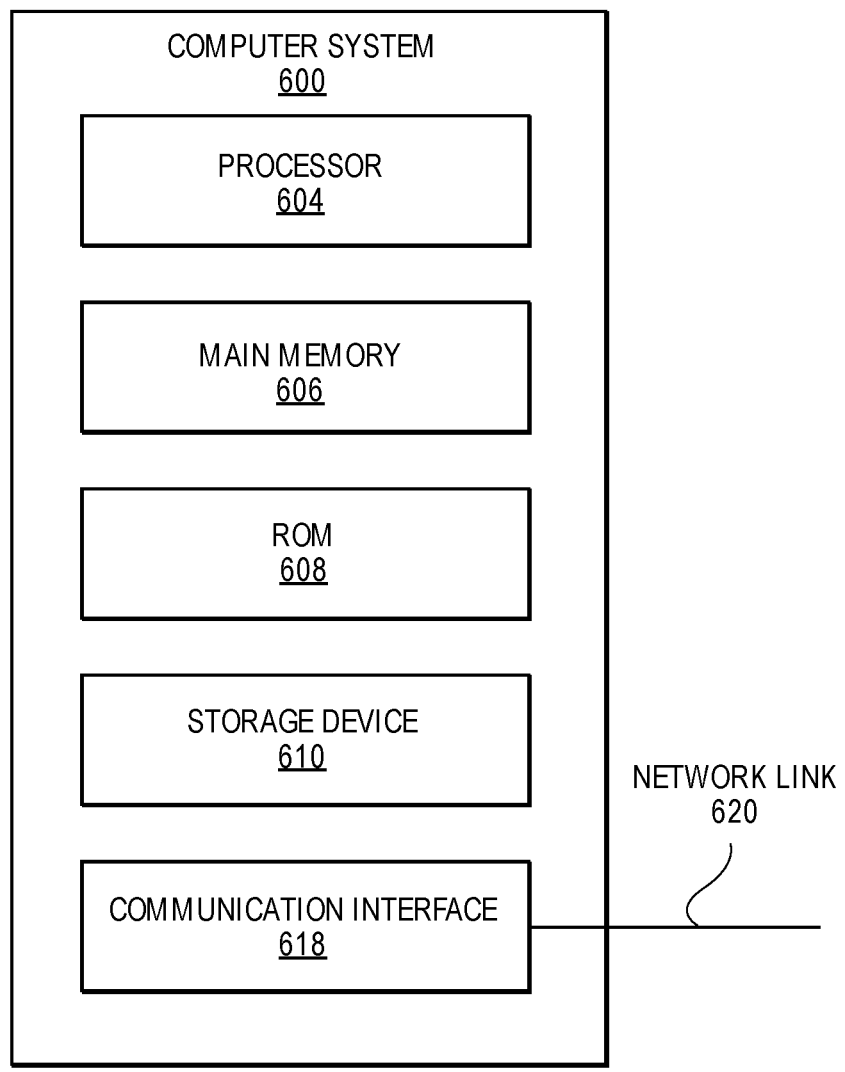
FIG. 6 is a block diagram that illustrates a computer system upon which an embodiment of the invention may be implemented.

In an embodiment, each component depicted in FIG. 1 as well as Remote PHY device 220 may correspond to, or be implemented on, a computer system. FIG. 6 is a block diagram that illustrates a computer system 600, which may be used to implement all or a portion of the functions performed by Remote PHY device 220 or CCAP Core 110 in an embodiment. In an embodiment, computer system 600 includes processor 604, main memory 606, ROM 608, storage device 610, and communication interface 618. Computer system 600 includes at least one processor 604 for processing information. Computer system 600 also includes a main memory 606, such as a random-access memory (RAM) or other dynamic storage device, for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device for storing static information and instructions for processor 604. A storage device 610, such as a magnetic disk or optical disk, is provided for storing information and instructions.

Embodiments of the invention are related to the use of computer system 600 for implementing the techniques described herein. According to one embodiment of the invention, those techniques are performed by computer system 600 in response to processor 604 executing one or more sequences of one or more instructions contained in main memory 606. Such instructions may be read into main memory 606 from another machine-readable medium, such as storage device 610. Execution of the sequences of instructions contained in main memory 606 causes processor 604 to perform the process steps described herein. In alternative embodiments, hard-wired circuitry may be used in place of or in combination with software instructions to implement embodiments of the invention. Thus, embodiments of the invention are not limited to any specific combination of hardware circuitry and software.

The term "non-transitory machine-readable storage medium" as used herein refers to any tangible medium that participates in storing instructions which may be provided to processor 604 for execution. Non-limiting, illustrative examples of non-transitory machine-readable media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or cartridge, or any other medium from which a computer can read.

Various forms of non-transitory machine-readable media may be involved in carrying one or more sequences of one or more instructions to processor 604 for execution. For example, the instructions may initially be carried on a magnetic disk of a remote computer. The remote computer can load the instructions into its dynamic memory and send the instructions over a network link 620 to computer system 600.

Communication interface 618 provides a two-way data communication coupling to a network link 620 that is connected to a local network. For example, communication interface 618 may be an integrated services digital network (ISDN) card or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through a local network to a host computer or to data equipment operated by an Internet Service Provider (ISP).

Computer system 600 can send messages and receive data, including program code, through the network(s), network link 620 and communication interface 618. For example, a server might transmit a requested code for an application program through the Internet, a local ISP, a local network, subsequently to communication interface 618. The received code may be executed by processor 604 as it is received, and/or stored in storage device 610, or other non-volatile storage for later execution.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-transitory computer-readable storage medium that stores one or more sequences of instructions for segregating a node port experiencing ingress noise, which when executed by one or more processors, cause:
    detecting that a particular node port, of a plurality of node ports of a node that provides a service to a plurality of cable modems, is experiencing ingress noise; and
    in response to detecting said particular node port is experiencing ingress noise, causing said particular node port to not be assigned to the same upstream device port of said node as any other node port of said node so that said particular node port is assigned to a different upstream device port of said node than any other node port of said node,
    wherein said node is a Remote PHY Node or a Remote MACPHY node (RMN),
    wherein each upstream device port of said node is in an upstream direction of communication with a Cable Modem Termination System (CMTS), and
    wherein each downstream device port of said node is in a downstream direction of communication with said CMTS.

2. The non-transitory computer-readable storage medium of claim 1, wherein execution of the one or more sequences of instructions further cause:
    in response to detecting said particular node port is experiencing ingress noise, causing all node ports assigned to the same upstream device port of said node to be assigned to the same downstream device port of said node.

3. The non-transitory computer-readable storage medium of claim 1, wherein execution of the one or more sequences of instructions further cause:
    after determining that the particular node port is no longer experiencing ingress noise, load balancing, at least one of (a) upstream traffic and (b) downstream traffic sent between said plurality of cable modems and said Cable Modem Termination System (CMTS) by dynamically adjusting to which node port of said node at least one of (a) each upstream device port and (b) each downstream device port is assigned.

4. An apparatus for segregating a node port experiencing ingress noise, which when executed by one or more processors, comprising:
    one or more processors; and
    one or more non-transitory computer-readable storage mediums storing one or more sequences of instructions, which when executed, cause:
        detecting that a particular node port, of a plurality of node ports of a node that provides a service to a plurality of cable modems, is experiencing ingress noise; and
        in response to detecting said particular node port is experiencing ingress noise, causing said particular node port to not be assigned to the same upstream device port of said node as any other node port of said node so that said particular node port is assigned to a different upstream device port of said node than any other node port of said node,
        wherein said node is a Remote PHY Node or a Remote MACPHY node (RMN),
        wherein each upstream device port of said node is in an upstream direction of communication with a Cable Modem Termination System (CMTS), and
        wherein each downstream device port of said node is in a downstream direction of communication with said CMTS.

5. The apparatus of claim 4, wherein execution of the one or more sequences of instructions further cause:
    in response to detecting said particular node port is experiencing ingress noise, causing all node ports assigned to the same upstream device port of said node to be assigned to the same downstream device port of said node.

6. The apparatus of claim 4, wherein execution of the one or more sequences of instructions further cause:
    after determining that the particular node port is no longer experiencing ingress noise, load balancing, at least one of (a) upstream traffic and (b) downstream traffic sent between said plurality of cable modems and said Cable Modem Termination System (CMTS) by dynamically adjusting to which node port of said node at least one of (a) each upstream device port and (b) each downstream device port is assigned.

7. A method for segregating a node port experiencing ingress noise, comprising:
   detecting that a particular node port, of a plurality of node ports of a node that provides a service to a plurality of cable modems, is experiencing ingress noise; and
   in response to detecting said particular node port is experiencing ingress noise, causing said particular node port to not be assigned to the same upstream device port of said node as any other node port of said node so that said particular node port is assigned to a different upstream device port of said node than any other node port of said node,
   wherein said node is a Remote PHY Node or a Remote MACPHY node (RMN),
   wherein each upstream device port of said node is in an upstream direction of communication with a Cable Modem Termination System (CMTS), and
   wherein each downstream device port of said node is in a downstream direction of communication with said CMTS.

8. The method of claim 7, further comprising:
   in response to detecting said particular node port is experiencing ingress noise, causing all node ports assigned to the same upstream device port of said node to be assigned to the same downstream device port of said node.

9. The method of claim 7, further comprising:
   after determining that the particular node port is no longer experiencing ingress noise, load balancing, at least one of (a) upstream traffic and (b) downstream traffic sent between said plurality of cable modems and said Cable Modem Termination System (CMTS) by dynamically adjusting to which node port of said node at least one of (a) each upstream device port and (b) each downstream device port is assigned.

* * * * *